US009929277B2

(12) United States Patent
Huang et al.

(10) Patent No.: US 9,929,277 B2
(45) Date of Patent: Mar. 27, 2018

(54) THIN FILM TRANSISTOR AND FABRICATION METHOD THEREOF, ARRAY SUBSTRATE AND DISPLAY

(71) Applicants: BOE TECHNOLOGY GROUP CO., LTD., Beijing (CN); BEIJING BOE DISPLAY TECHNOLOGY CO., LTD., Beijing (CN)

(72) Inventors: Changgang Huang, Beijing (CN); Zhenyu Zhang, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 0 days.

(21) Appl. No.: 14/436,953

(22) PCT Filed: Aug. 21, 2014

(86) PCT No.: PCT/CN2014/084932
§ 371 (c)(1),
(2) Date: Apr. 20, 2015

(87) PCT Pub. No.: WO2015/058581
PCT Pub. Date: Apr. 30, 2015

(65) Prior Publication Data
US 2016/0005870 A1 Jan. 7, 2016

(30) Foreign Application Priority Data
Oct. 21, 2013 (CN) .......................... 2013 1 0495817

(51) Int. Cl.
H01L 27/00 (2006.01)
H01L 29/786 (2006.01)
(Continued)

(52) U.S. Cl.
CPC ...... *H01L 29/7869* (2013.01); *H01L 21/0257* (2013.01); *H01L 21/02521* (2013.01);
(Continued)

(58) Field of Classification Search
CPC .............. H01L 27/12; H01L 29/66765; H01L 29/78609; H01L 29/78696;
(Continued)

(56) References Cited

U.S. PATENT DOCUMENTS 6,104,042 A * 8/2000 Sah ...................... H01L 27/1214
257/59
9,236,405 B2 * 1/2016 Liu ................... H01L 29/66765
(Continued)

FOREIGN PATENT DOCUMENTS

CN 1767175 A 5/2006
CN 101266951 A 9/2008
(Continued)

OTHER PUBLICATIONS

Nov. 19, 2014—(WO) International Search Report and Written Opinion PCT/CN2014/084932 with Eng Tran.
(Continued)

Primary Examiner — Dale E Page
Assistant Examiner — Quovaunda V Jefferson
(74) Attorney, Agent, or Firm — Banner & Witcoff, Ltd.

(57) ABSTRACT

Embodiments of the disclosure provide a thin film transistor and a fabrication method thereof, an array substrate and a display. The thin film transistor comprises a gate electrode, a gate insulating layer, an active layer, a source electrode and a drain electrode. The active layer comprises a first active layer and a second active layer; and the first active layer is arranged close to the gate insulating layer, and the second active layer is arranged close to the source electrode and the
(Continued)

drain electrode. A carrier mobility of the first active layer is greater than that of the second active layer.

17 Claims, 9 Drawing Sheets

(51) Int. Cl.
*H01L 27/12* (2006.01)
*H01L 29/24* (2006.01)
*H01L 21/02* (2006.01)
*H01L 29/66* (2006.01)

(52) U.S. Cl.
CPC ........ *H01L 21/02554* (2013.01); *H01L 27/12* (2013.01); *H01L 27/1225* (2013.01); *H01L 29/24* (2013.01); *H01L 29/66742* (2013.01); *H01L 29/786* (2013.01)

(58) Field of Classification Search
CPC ......... H01L 29/78669; H01L 29/78678; H01L 29/78618
See application file for complete search history.

(56) References Cited

U.S. PATENT DOCUMENTS

| | | | | |
|---|---|---|---|---|
| 2007/0154845 A1* | 7/2007 | Shin | ...................... | G02F 1/1368 430/311 |
| 2008/0108226 A1* | 5/2008 | Oh | ...................... | H01L 27/1214 438/762 |
| 2009/0085033 A1 | 4/2009 | Su et al. | | |
| 2010/0148178 A1* | 6/2010 | Godo | ...................... | H01L 27/12 257/59 |
| 2010/0187523 A1* | 7/2010 | Sakata | ...................... | H01L 29/16 257/43 |
| 2010/0213460 A1* | 8/2010 | Kondo | ............... | H01L 29/78678 257/43 |
| 2010/0301340 A1* | 12/2010 | Shih | .................. | H01L 29/78609 257/59 |
| 2011/0070691 A1 | 3/2011 | Ye | | |
| 2013/0037807 A1* | 2/2013 | Fukaya | ............... | H01L 27/1225 257/57 |
| 2013/0221343 A1 | 8/2013 | Son et al. | | |

FOREIGN PATENT DOCUMENTS

| | | |
|---|---|---|
| CN | 101630692 A | 1/2010 |
| CN | 101688286 A | 3/2010 |
| CN | 102769039 A | 11/2012 |
| CN | 103123910 A | 5/2013 |
| CN | 103500710 A | 1/2014 |
| CN | 103500764 A | 1/2014 |

OTHER PUBLICATIONS

Jul. 29, 2015—(CN) First Office Action for Appn 201310495817.6 with Eng Tran.

* cited by examiner

US 9,929,277 B2

THIN FILM TRANSISTOR AND FABRICATION METHOD THEREOF, ARRAY SUBSTRATE AND DISPLAY

The application is a U.S. National Phase Entry of International Application No. PCT/CN2014/084932 filed on Aug. 21, 2014, designating the United States of America and claiming priority to Chinese Patent Application No. 201310495817.6 filed on Oct. 21, 2013. The present application claims priority to and the benefit of the above-identified applications and the above-identified applications are incorporated by reference herein in their entirety.

TECHNICAL FIELD

Embodiments of the disclosure relate to a thin film transistor and a fabrication method thereof, an array substrate and a display.

BACKGROUND

Currently, as a size of a display increases, a frequency of a driving circuit is constantly increased, and a thin film transistor with a higher carrier mobility is required to serve as a switch of a pixel unit in the display. The conventional thin film transistor (TFT) adopts an amorphous silicon material as an active layer, with the carrier mobility being only 0.5 cm$^2$/V·s. For a large-sized display exceeding 80 inches, its driving frequency reaches 120 Hz, and correspondingly the active layer of the thin film transistor is required to have a carrier mobility of more than 1.0 cm$^2$/V·s. Obviously, the carrier mobility of the amorphous silicon TFT hardly meets the large-sized display. Therefore, people turn their attention to a metal oxide semiconductor active layer with a higher carrier mobility. Among the metal oxide semiconductors capable of serving as the active layer, ZnON has attracted much attention from people due to the advantages of high carrier mobility (greater than 100 cm$^2$/V·s), low raw material cost, simple manufacture process, enabling the TFT to have higher on-state current, greatly improving a response speed of pixels and suitable for large-sized display.

However, since the carrier mobility of the ZnON active layer is more than 200 times than that of the conventional amorphous silicon active layer, overhigh carrier mobility will cause an increase of leakage current of the TFT. Thus, the performance of the TFT is adversely influenced, the reliability of a TFT array substrate is reduced, and further the display quality of the display is degraded.

SUMMARY

Embodiments of the disclosure provide a thin film transistor. The thin film transistor comprises a gate electrode, a gate insulating layer, an active layer, a source electrode and a drain electrode. The active layer comprises a first active layer and a second active layer, the first active layer is arranged close to the gate insulating layer, and the second active layer is arranged close to the source electrode and the drain electrode, and a carrier mobility of the first active layer is greater than that of the second active layer.

For example, the first active layer comprises a ZnON semiconductor active layer, and the second active layer comprises a metal doped ZnON semiconductor active layer.

For example, a thickness of the first active layer is 1.0-1.8 times of a thickness of the second active layer.

For example, metal element for doping the second active layer comprises at least one of Al, Ga, Ge, In, Sn and Bi.

For example, a total doping concentration of the doped metal is 0.1-10%.

For example, the thin film transistor further comprises an etching barrier layer, and the etching barrier layer is arranged on the active layer and corresponding to a gap between the source electrode and the drain electrode.

Embodiments of the disclosure provided an array substrate. The array substrate comprises the thin film transistor as described above, and a pixel electrode. The pixel electrode is connected to the drain electrode of the thin film transistor.

For example, the array substrate further comprises a common electrode.

Embodiments of the disclosure provide a display. The display comprises the above array substrate.

Embodiments of the disclosure provide a fabrication method of a thin film transistor. The method comprises: forming a gate electrode, a gate insulating layer, an active layer, a source electrode and a drain electrode on a substrate. The forming the active layer on the substrate comprises: forming a first active layer and a second active layer on the substrate; and the first active layer is arranged close to the gate insulating layer, and the second active layer is arranged close to the source electrode and the drain electrode. A carrier mobility of the first active layer is greater than that of the second active layer.

For example, the first active layer comprises a ZnON semiconductor active layer, and the second active layer comprises a metal doped ZnON semiconductor active layer.

For example, a thickness of the first active layer is 1.0-1.8 times of a thickness of the second active layer.

For example, metal element for doping the second active layer comprises at least one of Al, Ga, Ge, In, Sn and Bi.

For example, a total doping concentration of the doped metal is 0.1-10%.

For example, the active layer, the source electrode and the drain electrode are formed on the substrate by a single patterning process, and the single patterning process comprises: forming a ZnON film, a metal doped ZnON film and a metal film on the substrate sequentially, and forming a photoresist layer on the metal film; and performing exposure, development and etching processes on the substrate where the photoresist layer has been formed by using a half-tone mask or a gray-tone mask, and then forming the ZnON semiconductor active layer, the metal doped ZnON semiconductor active layer, the source electrode and the drain electrode.

For example, the forming the metal doped ZnON film comprises: forming the metal doped ZnON film by sputtering.

For example, the method further comprises forming an etching barrier layer, and the etching barrier layer is formed on the active layer and corresponding to a gap between the source electrode and the drain electrode. The forming the active layer, the etching barrier layer, the source electrode and the drain electrode on the substrate comprises: forming a ZnON film, a metal doped ZnON film and an etching barrier film on the substrate sequentially, and forming a photoresist layer on the etching barrier film; performing exposure, development and etching processes on the substrate where the photoresist layer has been formed by using a half-tone mask or a gray-tone mask, and then forming the ZnON semiconductor active layer, the metal doped ZnON semiconductor active layer and the etching barrier layer; forming a metal film on the substrate where the active layer and the etching barrier layer have been formed, and forming another photoresist layer on the metal film; performing exposure, development and etching processes on the substrate where the another photoresist layer has been formed by using a normal mask, and then forming the source electrode and the drain electrode.

For example, the forming the metal doped ZnON film comprises: forming the metal doped ZnON film by sputtering.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
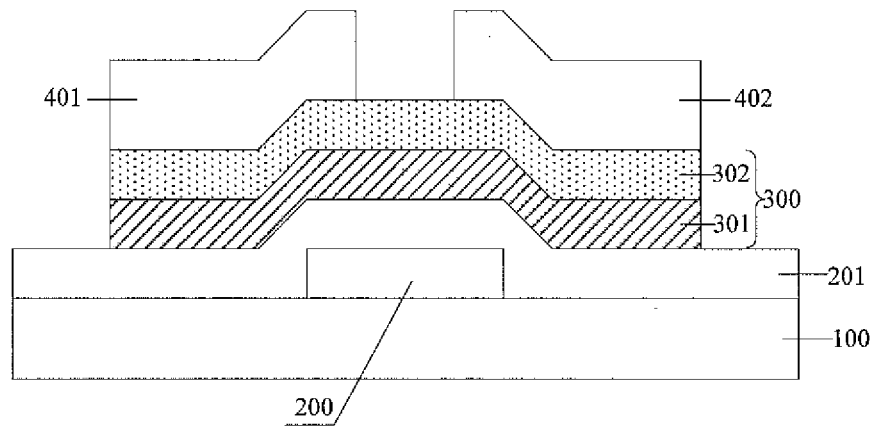
FIG. 1 is a schematic view I illustrating a thin film transistor of bottom gate type according to embodiments of the disclosure.

Embodiments of the disclosure provide a thin film transistor. As shown in FIG. 1, the thin film transistor comprises: a gate electrode 200, a gate insulating layer 201, an active layer 300, a source electrode 401 and a drain electrode 402. The active layer 300 comprises a first active layer 301 and a second active layer 302; and the first active layer 301 is arranged close to the gate insulating layer 201, and the second active layer 302 is arranged close to the source electrode 401 and the drain electrode 402; and a carrier mobility of the first active layer 301 is greater than that of the second active layer 302.

It should be noted that, those skilled in the art should understand that the active layer 300 is not limited to the above two layers, and the active layer 300 may have more than two layers as long as carrier mobilities of these layers constituting the active layer 300 decrease successively in a direction from the gate insulating layer 201 to the source electrode 401 and the drain electrode 402. However, it should be further noted that, it is not required that the layers constituting the active layer 300 are provided as more as possible, as long as a high ON state current of the thin film transistor is maintained and the leakage current of the thin film transistor is reduced while the basic performance of the thin film transistor is ensured.

In the embodiments of the disclosure, in order not to increase an overall thickness of the active layer 300, the case that the active layer 300 comprising the first active layer 301 and the second active layer 302 is described as an example; however the embodiments of the disclosure are not limited thereto.

It should be noted that, although the disclosure is described by taking the thin film transistor of bottom gate type as an example, those skilled in the art should understand that the first active layer 301 and the second active layer 302 may be applied to the thin film transistor of top gate type or a thin film transistor of any other structure, which is not limited here.

The embodiments of the disclosure provide a thin film transistor comprising the first active layer 301 and the second active layer 302 with different carrier mobilities. The first active layer 301 with a higher carrier mobility is arranged close to the gate insulating layer 201; when the thin film transistor is applied to a display, the higher ON state current of the thin film transistor is maintained so that the response speed of pixels in the display is significantly improved. Meanwhile, the second active layer 302 with a lower carrier mobility is arranged close to the source electrode 401 and the drain electrode 402, so the leakage current of the thin film transistor is reduced. Accordingly, the leakage current of the thin film transistor is reduced while the high ON state current of the thin film transistor is maintained, such that the thin film transistor meets the requirements of the large-sized display while the reliability of the thin film transistor is maintained.

For example, the first active layer 301 comprises a ZnON semiconductor active layer, and the second active layer 302 comprises a metal doped ZnON semiconductor active layer. That is, the first active layer 301 is made of ZnON and the second active layer 302 is made of metal doped ZnON.

For example, a thickness of the first active layer 301 is 1.0-1.8 times of that of the second active layer 302. Since the thickness of the second active layer 302 approximate the thickness of the first active layer 301, it can be ensured that when the first active layer 301 and the second active layer 302 are used as the active layer as a whole, their electric properties have a small difference.

For example, metal element for doping the second active layer 302 comprises at least one of Al, Ga, Ge, In, Sn and Bi.

For example, a total doping concentration of the metal is 0.1-10%; so the case that the doping elements hardly enter into the structure of ZnON or form other impurities when the doping concentration is too high.

Here, in the first active layer 301 formed by the ZnON semiconductor, since Zn—N bond energy between a Zn atom and a N atom is small, the N atom easily leaves its position in the ZnON semiconductor to form a vacancy which is called as an N vacancy; and a certain number of hole carriers are generated due to the generation of the N vacancy. A certain number of N vacancies generate a corresponding number of hole carriers; and due to attraction of Coulomb force, the hole carriers will attract electron carriers in the ZnON semiconductor to move along a certain direction, thus increasing carrier mobility in the ZnON semiconductor. Therefore, the first active layer 301 has the higher carrier mobility.

In the second active layer 302 formed by the metal doped ZnON semiconductor, since M-N bond energy between an atom of the doped metal element and an N atom is large (M comprises at least one metal element of Al, Ga, Ge, In, Sn and Bi), namely, a bonding strength of a chemical bond formed by the atom of the doped metal and the N atom is greater than the Zn—N bond energy between the Zn atom and the N atom. Thus, the N atom hardly leaves its position in the metal doped ZnON semiconductor, thereby inhibiting the generation of the N vacancies. Since the number of the N vacancies is reduced, the number of carriers in the metal doped ZnON semiconductor is reduced, and thus the carrier mobility of the metal doped ZnON semiconductor is reduced. Therefore, the second active layer 302 has the carrier mobility lower than that of the first active layer 301.

Figure 2:
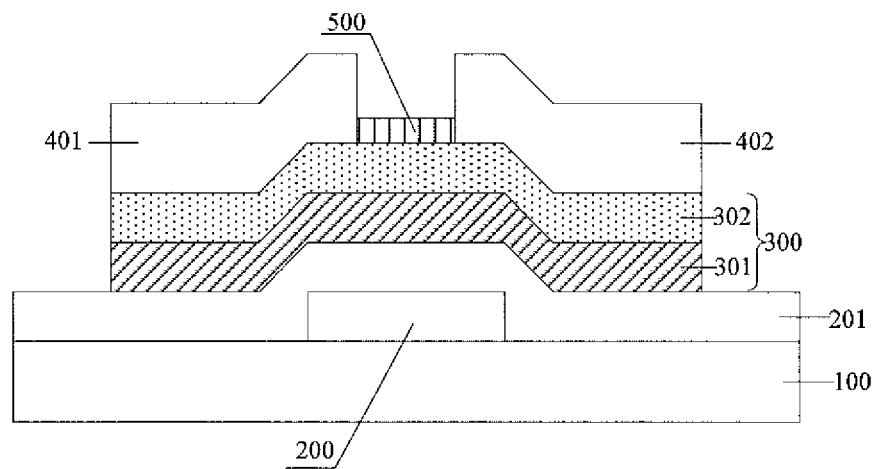
FIG. 2 is a schematic view II illustrating the thin film transistor of bottom gate type according to the embodiments of the disclosure.
Figure 3:
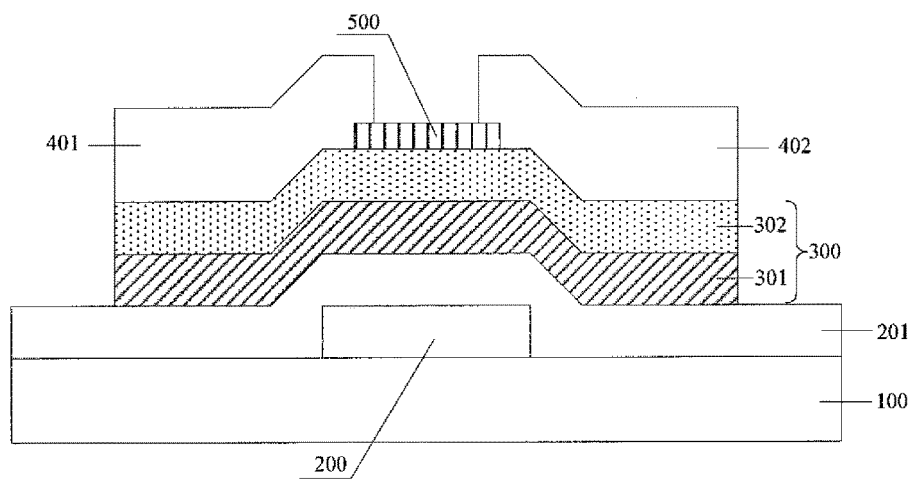
FIG. 3 is a schematic view III illustrating the thin film transistor of bottom gate type according to the embodiments of the disclosure.

For example, as shown in FIG. 2 and FIG. 3, the thin film transistor further comprises an etching barrier layer 500, and the etching barrier layer 500 is arranged on the active layer 300 and corresponding to a gap between the source electrode 401 and the drain electrode 402.

Here, the active layer 300 in the embodiments of the disclosure comprises the first active layer 301 formed by the ZnON semiconductor and the second active layer 302 formed by the metal doped ZnON semiconductor, namely, the first active layer 301 and the second active layer 302 are both formed by metal oxynitride semiconductor; and in this case, the active layer easily reacts with oxygen or water vapor in air when it is exposed outside, so characteristics of the thin film transistor are changed. Therefore, in the embodiments of the disclosure, for example the thin film transistor further comprises the etching barrier layer 500, and the etching barrier layer 500 is arranged on the active layer 300 and corresponding to the gap between the source electrode 401 and the drain electrode 402. The etching barrier layer 500 is further used for avoiding the adverse influence on the active layer 300 when a metal layer on the active layer 300 is etched to form the source electrode and the drain electrode in a subsequent process.

In addition, in order to avoid the adverse influence on the active layer when the gap between the source electrode 401 and the drain electrode 402 is formed by etching in the subsequent process, the etching barrier layer 500 may be of a structure as shown in FIG. 3. Namely, the etching barrier layer 500 is arranged on the active layer 300 and corresponding to the gap between the source electrode 401 and the drain electrode 402, and an area of the etching barrier layer 500 is slightly greater than that of the gap between the source electrode 401 and the drain electrode 402.

It should be noted that the embodiments of the disclosure do not limit the material of the etching barrier layer 500, as long as the active layer 300 is protected from being influenced in the process of etching the metal layer to be formed subsequently. For example, the etching barrier layer 500 is made of materials such as compact silicon oxide, silicon nitride, silicon oxynitride and the like.

Two examples are provided below to describe the thin film transistor according to the embodiments of the disclosure in detail.

EXAMPLE I

The embodiments of the disclosure provide the thin film transistor of bottom gate type. With reference to FIG. 2, the thin film transistor of bottom gate type comprises: the gate electrode 200, the gate insulating layer 201, the active layer 300, the source electrode 401 and the drain electrode 402. The active layer 300 comprises the first active layer 301 formed by the ZnON semiconductor and the second active layer 302 formed by the Ga—Al co-doped ZnON semiconductor; the first active layer 301 is arranged on the gate insulating layer 201, and the second active layer 302 is arranged on the first active layer 301; the thin film transistor further comprises the etching barrier layer 500, and the etching barrier layer 500 is arranged on the second active layer 302 and corresponding to the gap between the source electrode 401 and the drain electrode 402.

For example, the thickness of the first active layer 301 formed by the ZnON semiconductor is 1.5 times of that of the second active layer 302 formed by the Ga—Al co-doped ZnON semiconductor; and a total concentration the co-doped Ga—Al is 8%.

Since the second active layer 302 is made of the Ga—Al co-doped ZnON semiconductor, Ga—N bond energy and Al—N bond energy are greater than the Zn—N bond energy, the N atom hardly leaves its position in the Ga—Al co-doped ZnON semiconductor, thus inhibiting the generation of the N vacancies. Since the number of the N vacancies is reduced, the number of carriers in the Ga—Al co-doped ZnON semiconductor is reduced, and thus the carrier mobility of the Ga—Al co-doped ZnON semiconductor is reduced. Therefore, the second active layer 302 has the carrier mobility lower than that of the first active layer 301.

The first active layer 301 with the higher carrier mobility is arranged close to the gate insulating layer 201; when the thin film transistor of bottom gate type is applied to a display, the higher ON state current of the thin film transistor of bottom gate type is maintained so that the response speed of the pixels in the display is significantly improved. Meanwhile, the second active layer 302 with the lower carrier mobility is provided on the first active layer 301, that is, the second active layer 302 is arranged close to the source electrode 401 and the drain electrode 402, so the leakage current of the thin film transistor is reduced. Accordingly, the leakage current of the thin film transistor is reduced while the high ON state current of the thin film transistor is maintained, such that the thin film transistor meets the requirements of the large-sized display while the reliability of the thin film transistor is maintained.

EXAMPLE II

Figure 4:
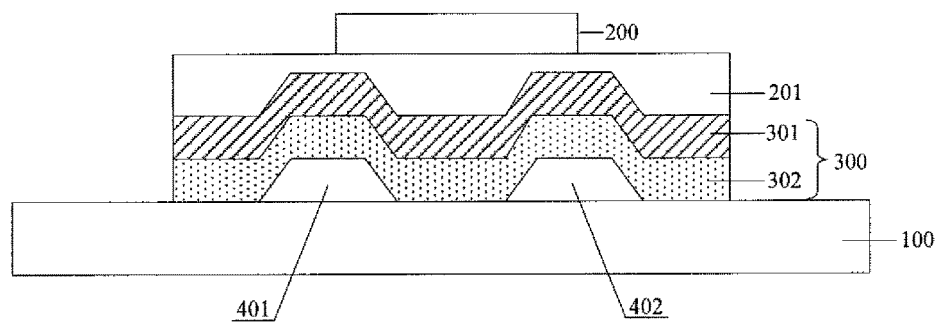
FIG. 4 is a schematic view illustrating a thin film transistor of top gate type according to the embodiments of the disclosure.

The embodiments of the disclosure provide the thin film transistor of top gate type. As shown in FIG. 4, the thin film transistor of top gate type comprises: the source electrode 401 and the drain electrode 402, the active layer 300, the gate insulating layer 201 and the gate electrode 200 which are arranged on a substrate 100 sequentially; the active layer 300 comprises the first active layer 301 formed by the ZnON semiconductor and the second active layer 302 formed by the Ge doped ZnON semiconductor; the second active layer 302 is arranged on the source electrode 401 and the drain electrode 402, and the first active layer 301 is arranged on the second active layer 302.

For example, the thickness of the first active layer 301 formed by the ZnON semiconductor is same as that of the second active layer 302 formed by the Ge doped ZnON semiconductor; and a total concentration of the doped Ge is 2.0%.

Since the second active layer 302 is made of the Ge doped ZnON semiconductor, Ge—N bond energy is greater than the Zn—N bond energy, the N atom hardly leaves its position in the Ge doped ZnON semiconductor, so that the carrier mobility of the Ge doped ZnON semiconductor is reduced. Therefore, the second active layer 302 has the carrier mobility lower than that of the first active layer 301. The second active layer 302 with the lower carrier mobility is arranged on the source electrode 401 and the drain electrode 402, so the leakage current of the thin film transistor is reduced. Meanwhile, the first active layer 301 with the higher carrier mobility is arranged on the second active layer 302, namely, the first active layer is arranged close to the gate insulating layer 201; when the thin film transistor of top gate type is applied to a display, the higher ON state current of the thin film transistor of top gate type is maintained so that the response speed of the pixels in the display is significantly improved. Accordingly, the high ON state current of the thin film transistor is maintained while the leakage current of the thin film transistor is reduced, such that the thin film transistor meets the requirements of the large-sized display while the reliability of the thin film transistor is maintained.

Figure 5:
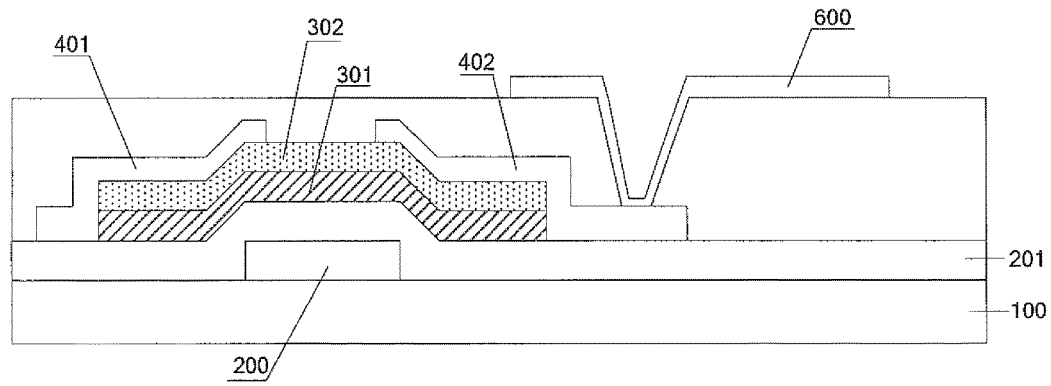
FIG. 5 is a schematic view I illustrating an array substrate according to the embodiments of the disclosure.

Embodiments of the disclosure further provide an array substrate. As shown in FIG. 5, the array substrate comprises the above thin film transistor as well as a pixel electrode 600 which is electrically connected with the drain electrode 402 of the thin film transistor.

The array substrate according to the embodiments of the disclosure is applicable to liquid crystal display devices of advanced super dimension switch (simplified as ADS) mode, twisted nematic mode and the like. In the ADS mode, a multi-dimensional electric field is formed with both an electric field generated at edges of slit electrodes in a same plane and an electric field generated between a slit electrode layer and a plate-like electrode layer, so that liquid crystal molecules at all orientations, which are provided directly above the electrodes or between the slit electrodes in a liquid crystal cell, can be rotated, In this way, the work efficiency of liquid crystal can be enhanced and the light transmittance can be increased. The ADS mode can improve the image quality of the thin film transistor liquid crystal display and has advantages of high resolution, high transmittance, low power consumption, wide viewing angle, high aperture ratio, low chromatic aberration, high response speed, free of push Mura, etc.

Figure 6:
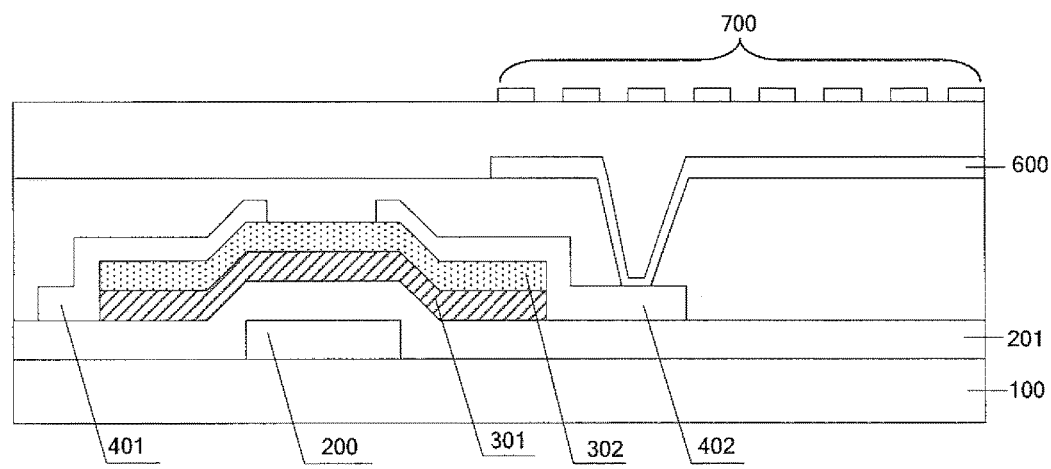
FIG. 6 is a schematic view II illustrating the array substrate according to the embodiments of the disclosure.

In addition, as shown in FIG. 6, the array substrate further comprises a common electrode 700.

Here, FIG. 6 only schematically illustrates a case that the common electrode 700 is provided above the pixel electrode 600. However, the array substrate may have the structure in which the common electrode 700 provided below the pixel electrode 600.

When the common electrode 700 is provided above the pixel electrode 600, the common electrode 700 formed in an upper layer for example comprise a plurality of strip electrodes electrically connected with each other; at this time, the common electrode 700 is of a structure having slits or of a comb-like structure, and the pixel electrode 600 formed in a lower layer is of a plate structure. However, the embodiments of the disclosure are not limited thereto, and the pixel electrode in the lower layer may comprise a plurality of strip electrodes electrically connected with each other. Similarly, in a case that the common electrode 700 is provided below the pixel electrode 600, the pixel electrode provided above is of a structure having slits, and the common electrode provided below is a plate electrode or an electrode having slits.

Embodiments of the disclosure further provide a display, and the display comprises the above array substrate.

For example, the display may be any product or component with a display function, such as a liquid crystal display, a liquid crystal television, a digital picture frame, a cellphone, a tablet computer and the like.

With respect to the thin film transistor as described above, the embodiments of the disclosure further provide a fabrication method of the thin film transistor. The method comprises: forming a gate electrode 200, a gate insulating layer 201, an active layer 300, a source electrode 401 and a drain electrode 402 on the substrate 100. The forming the active layer 300 on the substrate 100 comprises: forming a first active layer 301 and a second active layer 302 on the substrate 100. The first active layer 301 is arranged close to the gate insulating layer 201, and the second active layer 302 is arranged close to the source electrode 401 and the drain electrode 402; and a carrier mobility of the first active layer 301 is greater than that of the second active layer 302.

For example, the first active layer 301 comprises a ZnON semiconductor active layer, and the second active layer 302 comprises a metal doped ZnON semiconductor active layer.

For example, a thickness of the first active layer 301 is 1.0-1.8 times of that of the second active layer 302.

For example, metal element for doping the second active layer 302 comprises at least one of Al, Ga, Ge, In, Sn and Bi.

For example, a total doping concentration of the doped metal is 0.1-10%.

For example, the active layer 300, the source electrode 401 and the drain electrode 402 are formed by a single patterning process. Firstly, a ZnON film, a metal doped ZnON film and a metal film are sequentially formed on the substrate 100 and a photoresist layer is formed on the metal film; exposure, development and etching processes are performed on the substrate where the photoresist layer has been formed by using a half-tone mask or a gray-tone mask, and then the first active layer 301 formed by the ZnON semiconductor, the second active layer 302 formed by the metal doped ZnON semiconductor, and the source electrode 401 and the drain electrode 402 are formed.

A film formed by sputtering has the advantages: the formed film is uniform, the surface of the formed film is even, the thickness of the formed film is controllable, and the doping concentration of the formed film is controllable and the like; so the metal doped ZnON film for example is formed by magnetron sputtering.

As described above, exposure, development and etching processes are performed on the substrate where the photoresist layer has been formed by using the half-tone mask or the gray-tone mask, and then the first active layer 301, the second active layer 302, as well as the source electrode 401 and the drain electrode 402 are formed. The details of these processes are described as follows.

Exposure and development processes are performed on the substrate where the photoresist layer has been formed by using the half-tone mask or the gray-tone mask to form a photoresist completely reserved portion, a photoresist partially reserved portion and a photoresist completely removed portion. The photoresist completely reserved portion corresponds to a region for forming the source electrode 401 and the drain electrode 402, the photoresist partially reserved portion corresponds to a gap between the source electrode 401 and the drain electrode 402, and the photoresist completely removed portion corresponds to other regions.

Then, the ZnON film, the metal doped ZnON film and the metal film are removed from the photoresist completely removed portion by an etching process, to form the active layer comprising the first active layer 301 and the second active layer 302.

The photoresist is removed from the photoresist partially reserved region by an ashing process, and the exposed metal film is removed by an etching process to form the source electrode 401 and the drain electrode 402.

Finally, the photoresist is removed from the photoresist completely reserved portion by a stripping process.

In such way, the first active layer 301, the second active layer 302, as well as the source electrode 401 and the drain electrode 402 are formed by the single patterning process, and thus the number of patterning processes is reduced and the cost is reduced.

Here, as shown in FIG. 4, the thin film transistor may be the thin film transistor of top gate type. In the case that the thin film transistor is of top gate type, the method comprises: forming the source electrode 401 and the drain electrode 402 on the substrate 100 by a first patterning process, then forming the active layer 300 on the source electrode 401 and the drain electrode 402 by a second patterning process, wherein the active layer 300 comprises the first active layer 301 formed by the ZnON semiconductor and the second active layer 302 formed by the metal doped ZnON semiconductor, and the second active layer 302 is close to the source electrode 401 and the drain electrode 402; and then sequentially forming the gate insulating layer 201 and the gate electrode 200.

For example, the method further comprises forming an etching barrier layer 500. With reference to FIG. 2, the etching barrier layer 500 is formed at on the active layer 300 and corresponding to the gap between the source electrode 401 and the drain electrode 402.

Here, in order to avoid the adverse influence on the active layer when the gap between the source electrode 401 and the drain electrode 402 is formed by etching in the subsequent process, the etching barrier layer 500 may be of a structure as shown in FIG. 3. Namely, the etching barrier layer 500 is arranged on the active layer 300 and corresponding to the gap between the source electrode 401 and the drain electrode 402, and an area of the etching barrier layer 500 is slightly greater than that of the gap between the source electrode 401 and the drain electrode 402.

For example, the forming the active layer 300, the etching barrier layer 500, the source electrode 401 and the drain electrode 402 on the substrate comprises:

Forming a ZnON film, a metal doped ZnON film and an etching barrier film on the substrate 100 sequentially, and forming a photoresist layer on the etching barrier film; performing exposure, development and etching processes on the substrate where the photoresist layer has been formed by using a half-tone mask or a gray-tone mask, and then forming the ZnON semiconductor active layer, the metal doped ZnON semiconductor active layer, and the etching barrier layer 500.

Further, a metal film is formed on the substrate 100 where the active layer 300 and the etching barrier layer 500 have been formed, and another photoresist layer is formed on the metal film; exposure, development and etching processes are performed on the substrate 100 where the another photoresist layer has been formed, and then the source electrode 401 and the drain electrode 402 are formed.

A film formed by sputtering has the advantages: the formed film is uniform, the surface of the formed film is even, the thickness of the formed film is controllable, and the doping concentration of the formed film is controllable and the like; so the metal doped ZnON film for example is formed by magnetron sputtering.

Two specific examples are provided below to describe the fabrication method of the thin film transistor in detail.

EXAMPLE III

Figure 7:
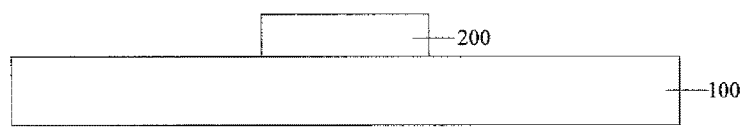
FIGS. 7-12 are schematic views illustrating a fabrication process of the thin film transistor of bottom gate type according to the embodiments of the disclosure.

The fabrication method of the thin film transistor is described in detail with the thin film transistor of bottom gate type as an example; in a case that the thin film transistor of bottom gate type does not comprise the etching barrier layer 500, the method comprises steps of:

S01: as shown in FIG. 7, forming a metal film on the substrate 100, and forming the gate electrode 200 on the substrate 100.

For example, a Cu metal film with a thickness of 1000-7000 Å is formed on a glass substrate by magnetron sputtering. Then the patterning process comprising exposure, development, etching and stripping is performed by using a normal mask, to form the gate electrode 200 on a certain region of the substrate 100, and to further form gate lines and gate line leads at the same time.

Figure 8:
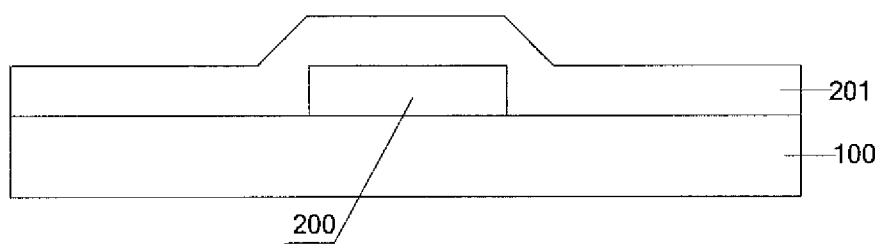

S02: as shown in FIG. 8, forming the gate insulating layer 201 on the substrate where step S01 has been completed.

For example, the gate insulating layer with a thickness of about 1000-6000 Å is deposited on the substrate where the gate electrode 200 is formed by chemical vapor deposition. For example, the gate insulating layer is made from silicon nitride, or may be made from silicon oxide or silicon oxynitride.

Figure 9:
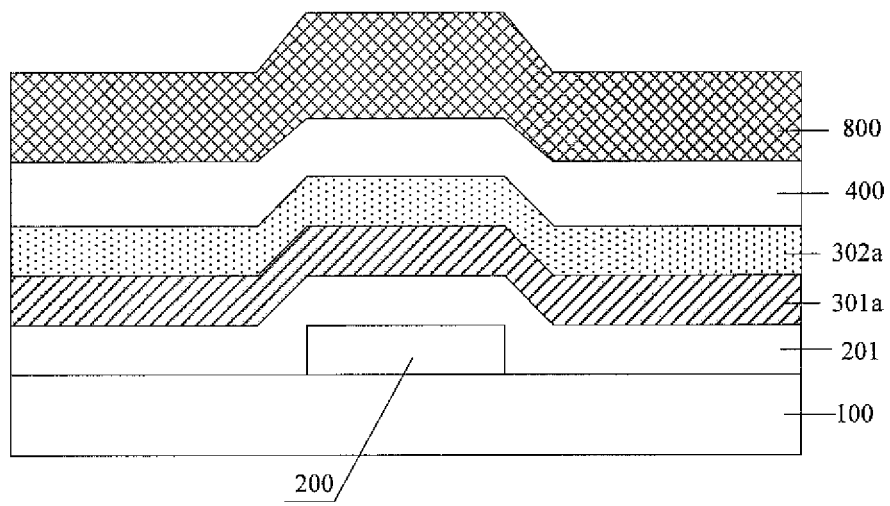

S03: as shown in FIG. 9, forming a ZnON film 301a, a Ga—Al co-doped ZnON film 302a and a metal film 400 sequentially on the substrate where step S02 has been completed, and forming a photoresist layer 800 on the metal film.

For example, the ZnON film 301a with the thickness of about 100-8000 Å and the Ga—Al co-doped ZnON film 302a with the thickness of about 100-8000 Å are deposited on the substrate by magnetron sputtering; and then a Mo metal film 400 with a thickness of about 1000-7000 Å is deposited on the substrate, and the photoresist layer 800 is coated on the Mo metal film 400.

Figure 10:
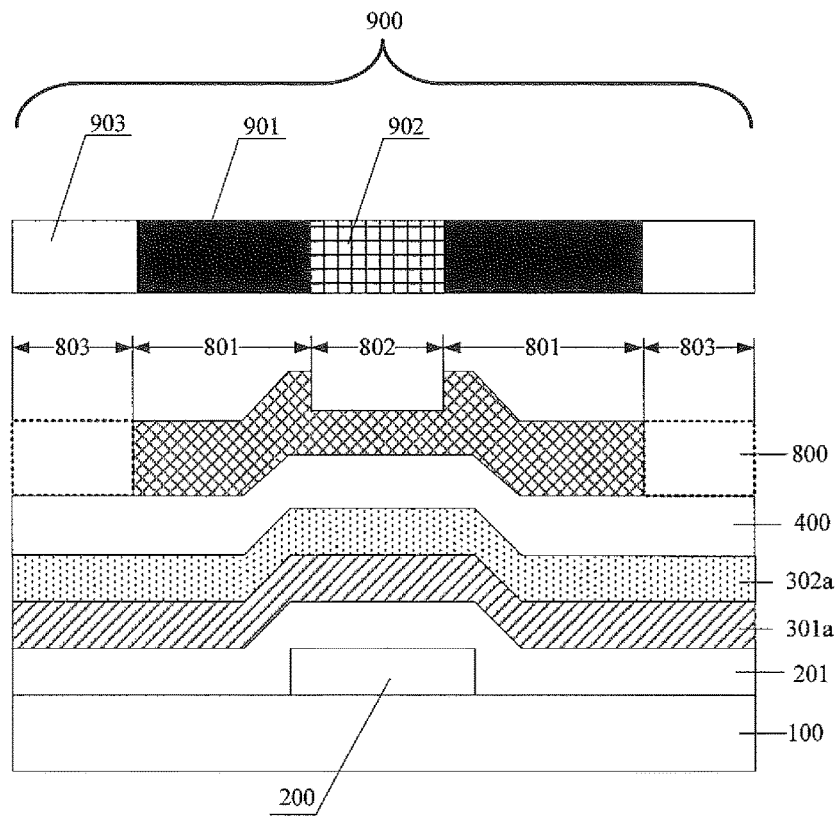

S04: as shown in FIG. 10, performing exposure and development processes on the substrate where the photoresist layer 800 has been formed by using the half-tone mask 900, and then forming the photoresist completely reserved portion 801, the photoresist partially reserved portion 802 and the photoresist completely removed portion 803.

The photoresist completely reserved portion 801 corresponds to the region for forming the source electrode 401 and the drain electrode 402, the photoresist partially reserved portion 802 corresponds to the gap between the source electrode 401 and the drain electrode 402, and the photoresist completely removed portion 803 corresponds to other regions.

Here, an operation principle of the normal mask is firstly described so as to better understand an operation principle of the half-tone mask 900.

The normal mask refers to a device that provides a light-shielding metal layer with a specific pattern on a transparent substrate so as to achieve a selective exposure of the photoresist layer 800. A region covered by the light-shielding metal layer is fully nontransparent and a region not covered by the light-shielding metal layer is fully transparent. When the photoresist layer 800 is exposed by the normal mask, the ultraviolet light cannot irradiate the part of the photoresist layer 800 corresponding to the fully nontransparent part of the normal mask, the photoresist completely reserved portion 801 is formed after development; at the same time, the photoresist layer 800 corresponding to the fully transparent part of the normal mask forms the photoresist completely removed portion 803 after development. In such a way, when the film covered by the photoresist is etched, the film covered by the photoresist completely reserved portion 801 is reserved, and the film covered by the photoresist completely removed portion 803 is fully etched and removed, so that at least one pattern layer with a specific pattern is formed.

By adopting the normal mask, patterns of the at least one pattern layer are same; however, when it is necessary to obtain at least two pattern layers with different patterns by a single patterning process, the half-tone mask 900 is needed.

With reference to FIG. 10, as compared with the normal mask, the half-tone mask 900 comprises a semi-transparent part 902 in addition to a fully nontransparent part 901 and a fully transparent part 903; namely, the half-tone mask 900 means that a nontransparent light-shielding metal layer is formed on a certain region on the transparent substrate material, a semi-transparent light-shielding metal layer is formed in another certain region, and no light-shielding metal layers are formed on other regions; wherein, a thickness of the semi-transparent light-shielding metal layer is less than that of the nontransparent light-shielding metal layer; in addition, a transmittance of the semi-transparent metal light-shielding layer to ultraviolet light can be changed by adjusting the thickness of the semi-transparent light-shielding metal layer.

Based on the above description, the operation principle of the half-tone mask 900 is as follows: by controlling thicknesses of the light-shielding metal layers of different regions on the half-tone mask 900, intensities of transmitted lights in different regions during exposure are different, so that after exposed and developed, the photoresist layer 800 forms the photoresist completely reserved portion 801, the photoresist partially reserved portion 802 and the photoresist completely removed portion 803 which respectively correspond to the fully nontransparent part 901, the semi-transparent part 902 and the fully transparent part 903 of the half-tone mask 900. In this way, during a first etching, films covered by the photoresist completely reserved portion 801 and the photoresist partially reserved portion 802 are reserved. Thereafter, as the thickness of the photoresist completely reserved portion 801 is greater than that of the photoresist partially reserved portion 802, the photoresist of the photoresist completely reserved portion 801 still exists after the photoresist of the photoresist partially reserved portion 802 is ached away; at this time, the exposed films are etched. Accordingly, at least two pattern layers with different patterns are obtained.

A principle of the gray-tone mask is similar to that of the half-tone mask, which will not be repeated here, and only differences between the gray-tone mask and the half-tone mask 900 are described. The semi-transparent part 902 of the half-tone mask is a semi-transparent light-shielding metal layer which is relatively thin and formed on the transparent substrate, namely, the transmittance of ultraviolet light is adjusted by controlling the thickness of the metal layer, so that exposure amount of the photoresist corresponding to this portion is different from that of other regions. The semi-transparent part of the gray-tone mask is of a strip-shaped slit structure; when ultraviolet light passes through the slit structure, optical phenomena such as scattering and diffraction occur, so the exposure amount of the photoresist corresponding to this portion is different from those of other regions.

The photoresist layer 800 in all embodiments of the disclosure are positive photoresist, namely, in the half-tone mask 900, the region corresponding to the photoresist completely removed portion 803 is a fully exposed region and corresponds to the fully transparent part 903 of the half-tone mask 900; the region corresponding to the photoresist partially reserved portion 802 is a half exposed region and corresponds to the semi-transparent part 902 of the half-tone mask 900; the region corresponding to the photoresist completely reserved portion 801 is a non-exposed region and corresponds to the nontransparent part 901 of the half-tone mask 900. However, the embodiments of the disclosure are not limited thereto, and the photoresist layer 800 may be negative photoresist.

Figure 11:
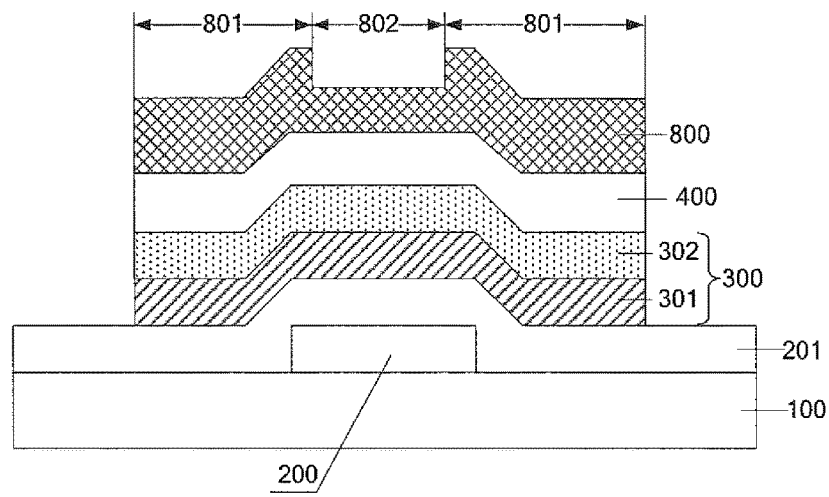

S05: as shown in FIG. 11, removing the ZnON film 301*a*, the Ga—Al co-doped ZnON film 302*a* and the metal film 400 which correspond to the photoresist completely removed portion 803 by an etching process to form the active layer 300.

The active layer 300 comprises the first active layer 301 formed by the ZnON semiconductor and close to the gate insulating layer 201, and the second active layer 302 provided on the first active layer 301 and formed by the metal doped ZnON semiconductor.

Figure 12:
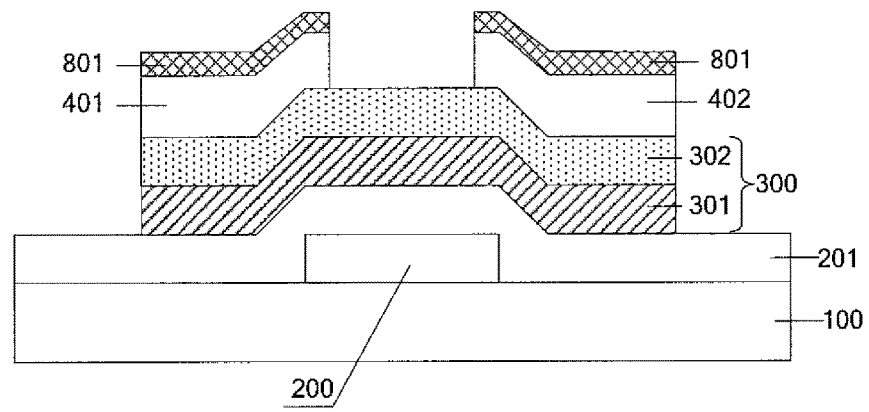

S06: as shown in FIG. 12, removing the photoresist 800 of the photoresist partially reserved portion 802 by an ashing process, and removing the exposed metal film 400 by an etching process, to form the source electrode 401 and the drain electrode 402.

S07: removing the photoresist of the photoresist completely reserved portion 801 by a stripping process, to form the thin film transistor as shown in FIG. 1.

EXAMPLE IV

The fabrication method of the thin film transistor is described in detail with the thin film transistor of bottom gate type as an example; in a case that the thin film transistor of bottom gate type comprises the etching barrier layer 500, the method comprises steps of:

S11: as shown in FIG. 7, forming a metal film on the substrate 100, and forming the gate electrode 200 on the substrate 100 by a single patterning process.

For example, a Cu metal film with a thickness of 1000-7000 Å is formed on a glass substrate by magnetron sputtering. Then the patterning process comprising exposure, development, etching and stripping is performed by using a normal mask, to form the gate electrode 200 on a certain region of the substrate 100, and to further form gate lines and gate line leads at the same time.

S12: as shown in FIG. 8, forming a gate insulating layer 201 on the substrate where step S11 has been completed.

For example, the gate insulating layer with a thickness of about 1000-6000 Å is deposited on the substrate where the gate electrode 200 is formed by chemical vapor deposition, wherein the gate insulating layer is for example made from silicon nitride, or may be made from silicon oxide or silicon oxynitride.

Figure 13:
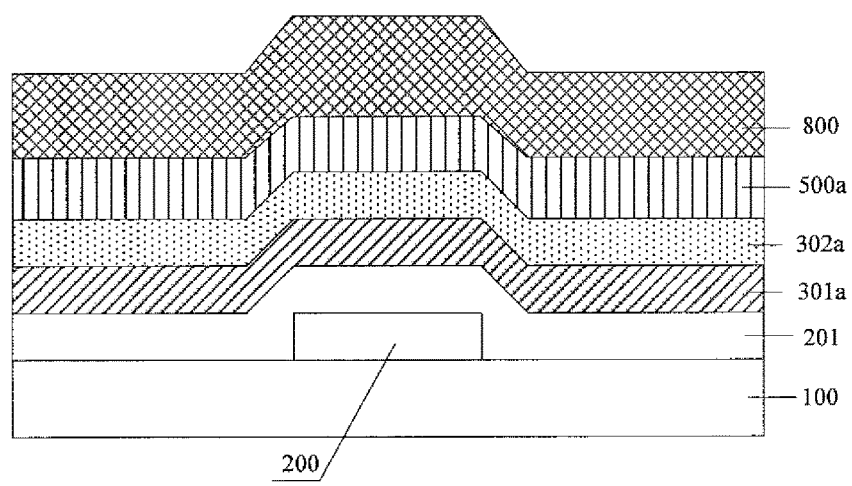
FIGS. 13-19 are schematic views illustrating a fabrication process of the thin film transistor of bottom gate type according to the embodiments of the disclosure.

S13: as shown in FIG. 13, forming a ZnON film 301*a*, an In doped ZnON film 302*a* and an etching barrier film 500*a* sequentially on the substrate where step S12 has been completed, and forming a photoresist layer 800 on the etching barrier film 500*a*.

For example, the ZnON film 301a with the thickness of about 100-8000 Å and the In doped ZnON film 302a with the thickness of about 100-8000 Å are deposited on the substrate by magnetron sputtering; and then a silicon nitride etching barrier film 500a with a thickness of about 500-3000 Å is deposited on the substrate, and the photoresist layer 800 is coated on the silicon nitride etching barrier film 500a.

Figure 14:
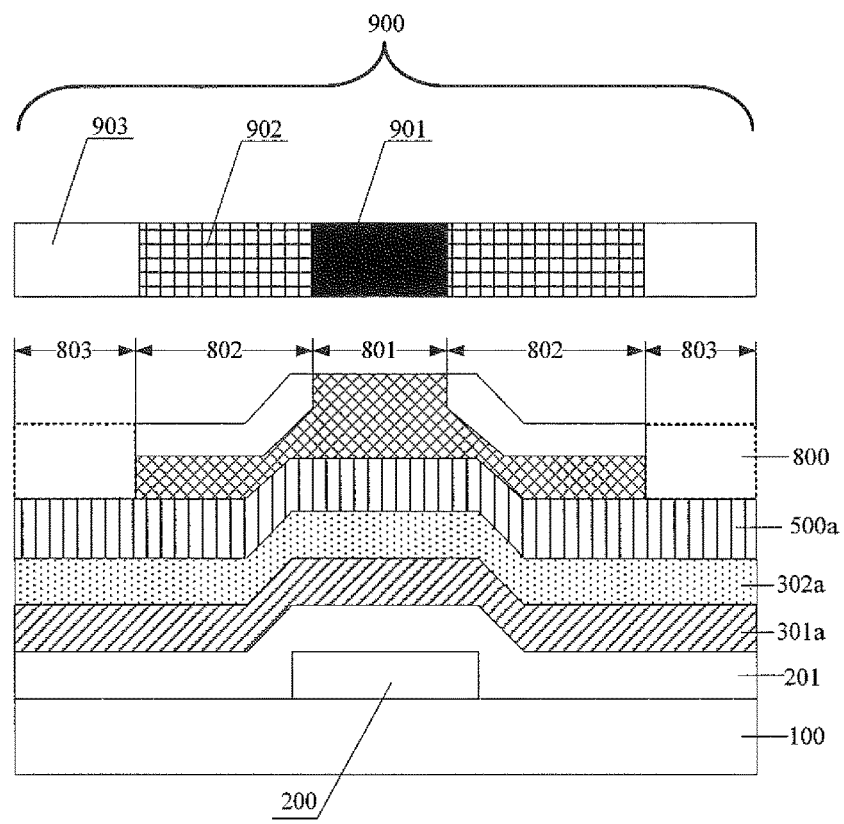

S14: as shown in FIG. 14, performing exposure and development processes on the substrate where the photoresist layer 800 has been formed by a half-tone mask 900, and then forming a photoresist completely reserved portion 801, a photoresist partially reserved portion 802 and a photoresist completely removed portion 803.

The photoresist completely reserved portion 801 corresponds to the region for forming the etching barrier layer 500, the photoresist partially reserved portion 802 corresponds to a portion of the active layer 300 which is not cover by the etching barrier layer 500, and the photoresist completely removed portion 803 corresponds to other regions.

Figure 15:
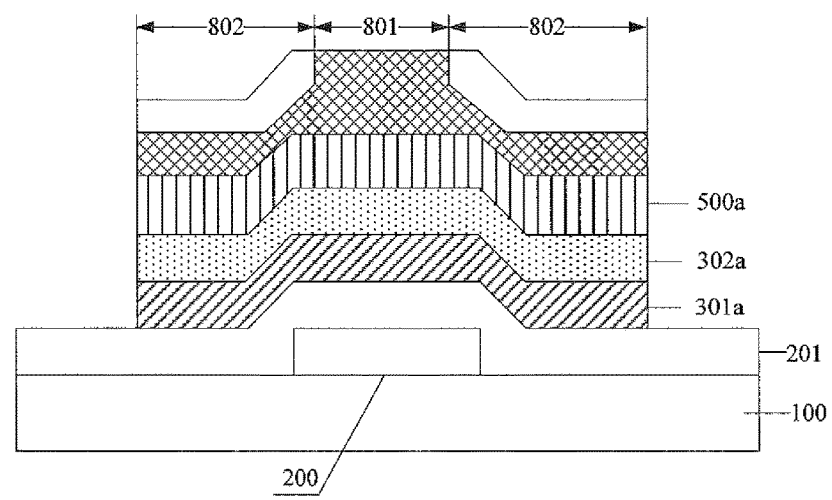

S15: as shown in FIG. 15, removing the ZnON film 301a, the In doped ZnON film 302a and the etching barrier film 500a which correspond to the photoresist completely removed portion 803 by an etching process, to form the active layer 300.

Figure 16:
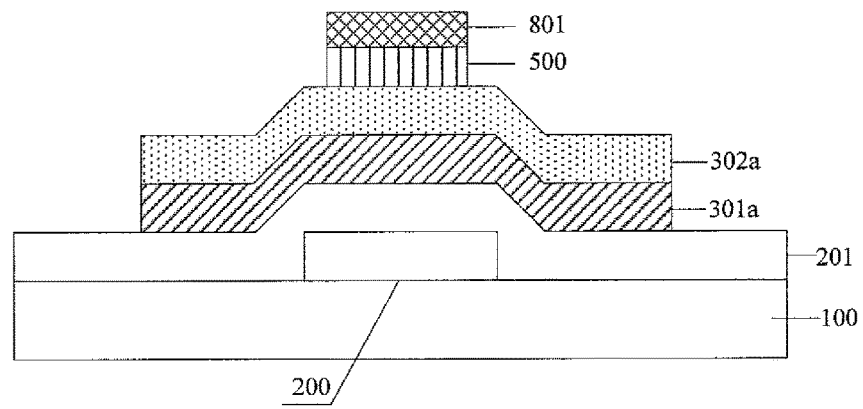

The active layer 300 comprises the first active layer 301 formed by the ZnON semiconductor and close to the gate insulating layer 201, and the second active layer 302 provided on the first active layer 301 and formed by a metal doped ZnON semiconductor S16: as shown in FIG. 16, removing the photoresist 800 of the photoresist partially reserved portion 802 by an ashing process, and removing the exposed etching barrier film 500a by an etching process, to form the etching barrier layer 500.

Then, the photoresist 800 of the photoresist completely reserved portion 801 is removed by a stripping process.

Figure 17:
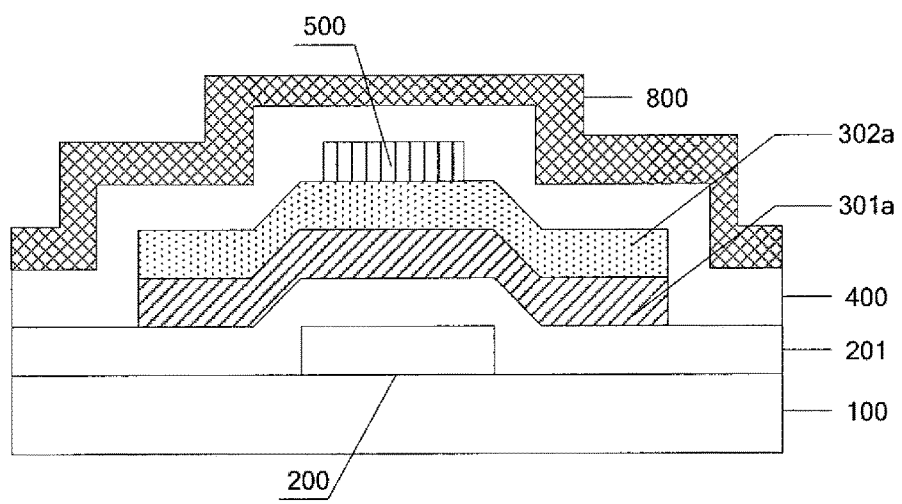

S17: as shown in FIG. 17, forming a Mo metal film 400 with a thickness of about 100-7000 Å on the substrate where step S16 has been completed, and forming another photoresist layer 800 on the Mo metal film 400.

Figure 18:
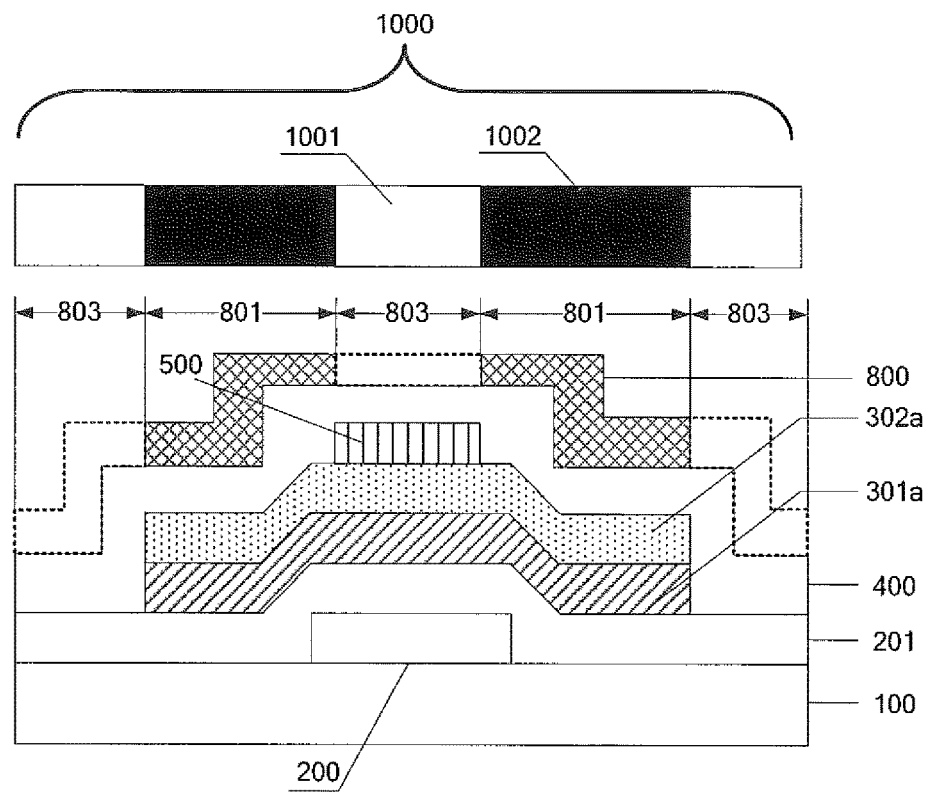

S18: as shown in FIG. 18, performing exposure and development on the substrate where the another photoresist layer 800 has been formed by using a normal mask 100, and then forming the photoresist completely reserved portion 801 and the photoresist completely removed portion 803.

The photoresist completely reserved portion 801 corresponds to the region for forming the source electrode 401 and the drain electrode 402, and the photoresist completely removed portion 803 corresponds to the gap between the source electrode 401 and the drain electrode 402 and other regions.

Figure 19:
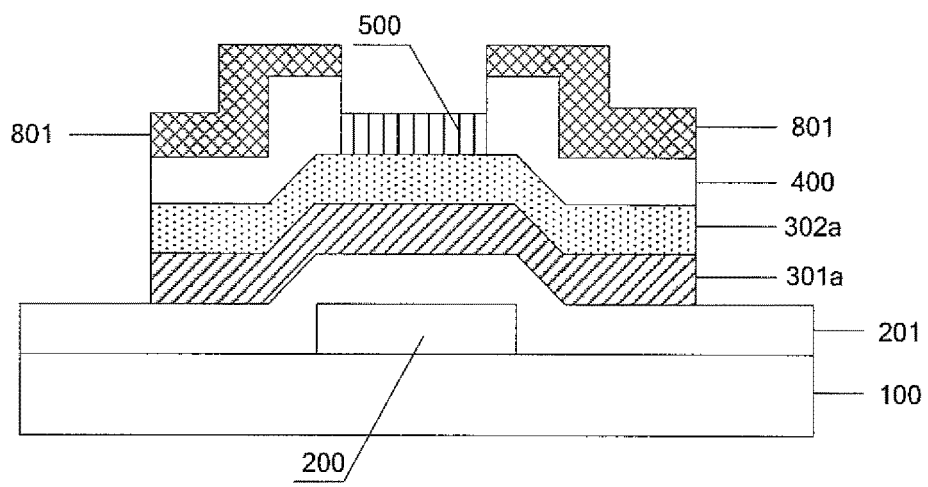

S19: as shown in FIG. 19, removing the Mo metal film 400 corresponding to the photoresist completely removed portion 803 by an etching process, to form the source electrode 401 and the drain electrode 402.

S20: removing the photoresist of the photoresist completely reserved portion 801 by a stripping process, to form the thin film transistor referring to FIG. 2.

In addition, on the basis of the above steps S01-S07 or S11-S20, a protective layer with a vie hole exposing the drain electrode 402, and a pixel electrode connected with the drain electrode 402 through the via hole may be sequentially formed, so as to prepare the array substrate. Certainly, a passivation layer and a common electrode may be formed above the pixel electrode sequentially.

What are described above are exemplary embodiments of the disclosure, and are not limitative of the projection scope of the disclosure, which is determined by appended claims.

The application claims priority of Chinese Patent Application No. 201310495817.6 filed on Oct. 21, 2013, the disclosure of which is incorporated herein by reference in its entirety as part of the present application.

What is claimed is:

1. A thin film transistor, comprising: a gate electrode, a gate insulating layer, an active layer, a source electrode and a drain electrode, wherein:
    the active layer comprises a first active layer, a second active layer and a third active layer, the first active layer is arranged close to the gate insulating layer, the third active layer is arranged between the first active layer and the second active layer, and the second active layer is arranged close to the source electrode and the drain electrode;
    a carrier mobility of the first active layer is greater than a carrier mobility of the third active layer, and the carrier mobility of the third active layer is greater than a carrier mobility of the second active layer, wherein the first active layer comprises a ZnON semiconductor active layer, the second active layer comprises a metal doped ZnON semiconductor active layer;
    wherein the thin film transistor further comprises an etching barrier layer, and the etching barrier layer is disposed on a portion of the active layer that corresponds to a gap between the source electrode and the drain electrode; and
    wherein a total doping concentration of the doped metal is 0.1-10%.

2. The thin film transistor according to claim 1, wherein a thickness of the first active layer is 1.0-1.8 times of a thickness of the second active layer.

3. The thin film transistor according to claim 1, wherein metal element for doping the second active layer further comprises at least one of Ge, In, Sn and Bi.

4. An array substrate, comprising the thin film transistor according to claim 1, and a pixel electrode electrically connected with the drain electrode of the thin film transistor.

5. The array substrate according to claim 4, wherein the array substrate further comprises a common electrode.

6. The thin film transistor according to claim 1, wherein the metal doped ZnON semiconductor active layer comprises a Ga—Al co-doped ZnON semiconductor active layer.

7. A fabrication method of a thin film transistor, comprising:
    forming a gate electrode, a gate insulating layer, an active layer, a source electrode and a drain electrode on a substrate,
    wherein the forming the active layer on the substrate comprises:
    forming a first active layer, a second active layer and a third active layer on the substrate, wherein the first active layer is arranged close to the gate insulating layer, the third active layer is arranged between the first active layer and the second active layer, and the second active layer is arranged close to the source electrode and the drain electrode;
    wherein a carrier mobility of the first active layer is greater than a carrier mobility of the third active layer, and the carrier mobility of the third active layer is greater than a carrier mobility of the second active layer, wherein the first active layer comprises a ZnON semiconductor active layer, the second active layer comprises a metal doped ZnON semiconductor active layer; and wherein the method further comprises forming an etching barrier layer, and the etching barrier layer is formed on the active layer and corresponds to a gap between the source electrode and the drain electrode;

wherein the forming the active layer, the etching barrier layer, the source electrode and the drain electrode on the substrate comprises:

forming a ZnON film, a metal doped ZnON film and an etching barrier film on the substrate sequentially, and forming a photoresist layer on the etching barrier film;

performing exposure, development and etching processes on the substrate where the photoresist layer has been formed by using a half-tone mask or a gray-tone mask, and then forming the ZnON semiconductor active layer, the metal doped ZnON semiconductor active layer and the etching barrier layer;

forming a metal film on the substrate where the active layer and the etching barrier layer have been formed, and forming another photoresist layer on the metal film;

performing exposure, development and etching processes on the substrate where the another photoresist layer has been formed by using a normal mask, and then forming the source electrode and the drain electrode; and wherein a total doping concentration of the doped metal is 0.1-10%.

8. The method according to claim 7, wherein a thickness of the first active layer is 1.0-1.8 times of a thickness of the second active layer.

9. The method according to claim 7, wherein metal element for doping the second active layer further comprises at least one of Ge, In, Sn and Bi.

10. The method according to claim 7, wherein the forming the metal doped ZnON film comprises: forming the metal doped ZnON film by sputtering.

11. The method according to claim 7, wherein the metal doped ZnON semiconductor active layer comprises a Ga—Al co-doped ZnON semiconductor active layer.

12. A fabrication method of a thin film transistor, comprising: forming a gate electrode, a gate insulating layer, an active layer, an etching barrier layer, a source electrode and a drain electrode on a substrate, wherein the forming the active layer on the substrate comprises:

forming a first active layer, a second active layer and a third active layer on the substrate, wherein the first active layer is arranged close to the gate insulating layer, the third active layer is arranged between the first active layer and the second active layer, and the second active layer is arranged close to the source electrode and the drain electrode;

wherein a carrier mobility of the first active layer is greater than a carrier mobility of the third active layer, and the carrier mobility of the third active layer is greater than a carrier mobility of the second active layer, wherein the first active layer comprises a ZnON semiconductor active layer, the second active layer comprises a metal doped ZnON semiconductor active layer;

wherein the etching barrier layer is disposed on a portion of the active layer that corresponds to a gap between the source electrode and the drain electrode; and wherein a total doping concentration of the doped metal is 0.1-10%.

13. The method according to claim 12, wherein a thickness of the first active layer is 1.0-1.8 times of a thickness of the second active layer.

14. The method according to claim 12, wherein metal element for doping the second active layer further comprises at least one of Ge, In, Sn and Bi.

15. The method according to claim 12, wherein:

the forming the active layer, the etching barrier layer, the source electrode and the drain electrode on the substrate comprises:

forming a ZnON film, a metal doped ZnON film and an etching barrier film on the substrate sequentially, and forming a photoresist layer on the etching barrier film;

performing exposure, development and etching processes on the substrate where the photoresist layer has been formed by using a half-tone mask or a gray-tone mask, and then forming the ZnON semiconductor active layer, the metal doped ZnON semiconductor active layer and the etching barrier layer;

forming a metal film on the substrate where the active layer and the etching barrier layer have been formed, and forming another photoresist layer on the metal film; and performing exposure, development and etching processes on the substrate where the another photoresist layer has been formed by using a normal mask, and then forming the source electrode and the drain electrode.

16. The method according to claim 15, wherein the forming the metal doped ZnON film comprises: forming the metal doped ZnON film by sputtering.

17. The method according to claim 12, wherein the metal doped ZnON semiconductor active layer comprises a Ga—Al co-doped ZnON semiconductor active layer.

* * * * *